United States Patent
Cellier et al.

(10) Patent No.: US 9,071,206 B2
(45) Date of Patent: Jun. 30, 2015

(54) ANTI-GLITCH SYSTEM FOR AUDIO AMPLIFIER

(75) Inventors: Remy Cellier, Lyons (FR); Francois Amiard, Grenoble (FR)

(73) Assignee: ST-Ericsson SA, Plan-les-Ouates (CH)

( * ) Notice: Subject to any disclaimer, the term of this patent is extended or adjusted under 35 U.S.C. 154(b) by 559 days.

(21) Appl. No.: 13/322,862

(22) PCT Filed: May 27, 2010

(86) PCT No.: PCT/EP2010/057311
§ 371 (c)(1),
(2), (4) Date: Nov. 28, 2011

(87) PCT Pub. No.: WO2010/136520
PCT Pub. Date: Dec. 2, 2010

(65) Prior Publication Data
US 2012/0068770 A1    Mar. 22, 2012

(30) Foreign Application Priority Data

May 29, 2009    (FR) .................................... 09 53599

(51) Int. Cl.
*H01B 15/00* (2006.01)
*H03F 1/30* (2006.01)
*H03F 3/72* (2006.01)
*H03G 3/34* (2006.01)

(52) U.S. Cl.
CPC ............... *H03F 1/305* (2013.01); *H03G 3/348* (2013.01); *H03F 3/72* (2013.01); *H03F 2200/03* (2013.01); *H03F 2203/7212* (2013.01); *H03F 2203/7215* (2013.01)

(58) Field of Classification Search
CPC .......... H03G 3/348; H03F 1/305; H03F 3/72; H03F 2200/414; H03F 1/0277; H03F 2200/03
USPC .................................................... 381/94.5
See application file for complete search history.

(56) References Cited

U.S. PATENT DOCUMENTS 7,312,654 B2 * 12/2007 Roeckner et al. ............... 330/10
7,313,244 B2    12/2007 Ryoo et al.

FOREIGN PATENT DOCUMENTS

EP    1229639 A2    8/2002
EP    1689075 A1    8/2006

OTHER PUBLICATIONS

Patent Cooperation Treaty International Search Report and Written Opinion of PCT/EP2010/057311; Jules Van den Doel; Jul. 6, 2010; 7 pages.
Institut National De La Propriete Industrielle; Rapport de Recherche Preliminaire; French Search Report and Written Opinion; Jules Van den Doel; Nov. 20, 2009; 6 pages.

* cited by examiner

*Primary Examiner* — Duc Nguyen
*Assistant Examiner* — Kile Blair
(74) *Attorney, Agent, or Firm* — Howison & Arnott, LLP

(57) ABSTRACT

An audio amplification circuit comprises an amplifier having an input and an output, as well as an audio output to which a load can be connected. It additionally comprises a first driver stage having an input and an output which is not coupled to the audio output, and a second driver stage having an input and an output which is coupled to the audio output. The output from the amplifier is selectively coupled to the input of the first driver stage in a first phase of operation and then selectively to the input of the second driver stage in a second phase of operation following the first phase of operation.

9 Claims, 3 Drawing Sheets

ANTI-GLITCH SYSTEM FOR AUDIO AMPLIFIER

CROSS-REFERENCE TO RELATED APPLICATIONS

This application is a U.S. National Phase application submitted under 35 U.S.C. §371 of Patent Cooperation Treaty application serial no. PCT/EP2010/057311, filed May 27, 2010, and entitled ANTI-GLITCH SYSTEM FOR AUDIO AMPLIFIER, which application claims priority to French patent application serial no. FR 09 53599, filed May 29, 2009, and entitled ANTI-GLITCH SYSTEM FOR AUDIO AMPLIFIER.

Patent Cooperation Treaty application serial no. PCT/EP2010/057311, published as WO 2010/136520, and French patent application serial no. FR 09 53599, are incorporated herein by reference.

TECHNICAL FIELD

The present invention relates in general to the amplification of audio signals, and in particular to an anti-glitch system for an audio amplifier.

The invention has applications in particular in the integrated circuits equipping devices that have an audio signal reproduction function, such as mobile telephones, portable MP3 or MP4 players, etc. In such an application, the audio amplifier is designed to drive the speaker or headset jack of the device

BACKGROUND

When the audio amplifier is powered on, this produces unwanted noise which is called a "pop" by those skilled in the art. This pop is considered to be a defect audible to the user of the device. It is unpleasant to hear, particularly when listening through headphones or earphones.

FIG. 1 shows the evolution over time of the output voltage Vout(t) of the audio amplifier at power-on and in the absence of an input signal to the amplifier. The pop arises from the generation of a voltage peak 1, which is called a glitch, and the presence of a non-zero voltage level 2 corresponding to the offset voltage of the amplifier.

A glitch is a momentary disturbance in the amplitude of the output signal, such as in the case of a temporary impedance mismatch. It is due primarily to the transient state which follows activation of the circuit. Its origin lies in the delay required for the various circuit components to reach the operating point.

In practice, it is not uncommon to observe glitch voltages of around +500 mV for about 2 µs, depending on the load driven by the amplifier. Such a glitch is audible to the user.

Techniques exist for decreasing the unwanted noise in the audio signal reproduced for the user, caused by the glitch which occurs when power is turned on. Such a technique is presented in the document U.S. Pat. No. 7,313,244.

However, the solution in said document is unsuitable for the applications considered here, because it is incompatible with the constraints related to integrating an analog audio amplifier on a silicon chip.

SUMMARY

There is therefore a need for a solution that eliminates, or at least attenuates, the glitch of an audio amplifier.

For this purpose, an audio amplifier circuit is proposed comprising an amplifier having an input and an output and an audio output to which a load can be connected.

The circuit additionally comprises a first driver stage having an input and an output which is not coupled to the audio output and a second driver stage having an input and an output which is coupled to the audio output. The amplifier output is selectively coupled to the input of the first driver stage in a first phase of operation following the powering on of the circuit, or to the input of the second driver stage in a second phase of operation following the first phase of operation.

Advantageously, the first driver stage is therefore a "dummy" output stage, which is used only during the phase in which the amplifier operating point is reached, but it is not coupled to the audio output of the circuit. Thus the glitch which occurs when the power is turned on produces no effects in the output signal of the circuit. Then the second driver stage takes over, as the conventional power output stage.

In one embodiment, the circuit comprises an impedance arranged to couple the output of the first driver stage to the input of the amplifier in a first phase of operation, or the output of the second driver stage to the input of the amplifier in the second phase of operation.

In this manner, it is advantageously the same impedance which serves to stabilize the circuit in the two phase of operation.

For example, the second driver stage is a power output stage, sized to deliver a drive current of a given value, while the first driver stage is a stage of the same structure as the second driver stage but sized to deliver a current substantially lower than said drive current.

As the first driver stage is not used to deliver power, it does not need to occupy as much space on the chip as the second driver stage.

The circuit can comprise a control unit configured to control the first phase of operation in response to the circuit being powered on, and then to control the second phase of operation at the end of a given period of time. This is the simplest form of embodiment, but is obviously not limiting.

The control unit can additionally be configured to control the first phase of operation in response to a signal to activate a "mute" mode of the device incorporating the amplification circuit.

This provides an elegant means of handling this mode of operation without the addition of any additional circuitry.

The invention also concerns a process of audio amplification using an amplification circuit comprising an amplifier having an input for receiving an input signal and an output, and additionally comprising an audio output to which a load can be connected, with said process comprising the steps consisting of:

in a first phase of operation following the powering on of the circuit, coupling the amplifier output to an input of a first driver stage having an output which is not coupled to the audio output; then, selectively, in a second phase of operation following the first phase of operation, coupling the output of the amplifier to an input of a second driver stage having an output which is coupled to the audio output.

The invention also concerns a device comprising an audio signal source and an amplification circuit as defined above, for amplification of the audio signal.

BRIEF DESCRIPTION OF THE DRAWINGS

Other features and advantages of the invention will become apparent from reading the following description. This description is purely illustrative and is to be read in light of the attached drawings, in which:

FIG. 1, already discussed, shows a graph over time of the voltage output from an audio amplifier without glitch correction, when the amplifier is powered on;

DETAILED DESCRIPTION

Figure 2:
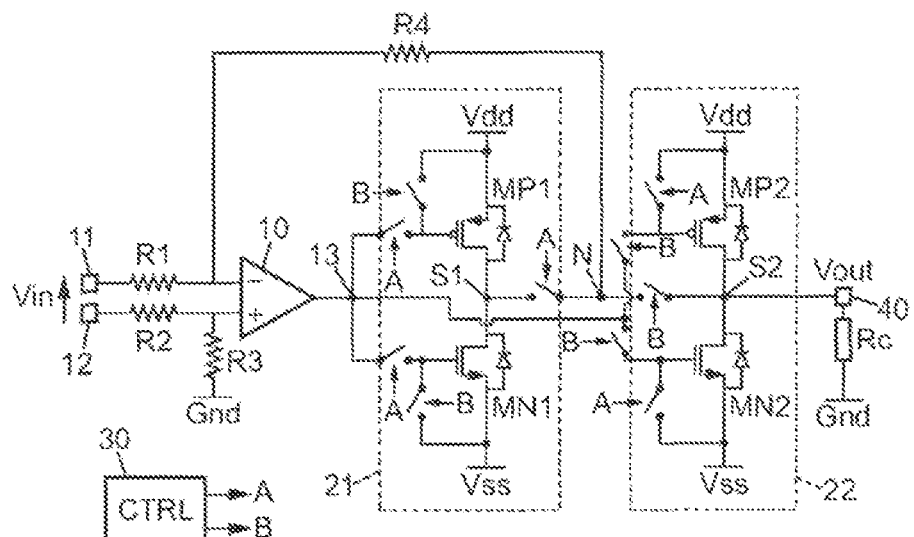
FIG. 2 is a detailed diagram of an embodiment of an audio amplification circuit incorporating the principle of glitch cancellation according to embodiments of the invention.

FIG. 2 diagrams an example of an audio amplification circuit incorporating glitch cancellation according to the principle used by embodiments of the invention.

The amplification circuit comprises an amplifier 10, typically a class AB amplifier. This is typically a differential amplifier, such as an operational amplifier. Such an amplifier comprises an input stage with a differential pair of transistors. The transistors are MOS transistors, with the amplification circuit realized for example using CMOS technology (Complementary Metal Oxide Semiconductor).

The audio amplification circuit comprises an input 11 for receiving an audio input signal Vin to be amplified. It also comprises an output 13 for delivering an audio output signal corresponding to the amplified signal Vin.

The input signal is for example a differential voltage, defined by the difference between two components V+ and V−, respectively received at the input 11 and at another input 12 of the circuit. The input 11 of the circuit is for example coupled to the inverting input of the amplifier 10 (designated by a "−" sign in the figure), via an impedance R1, for example a resistor. Similarly, the input 12 of the circuit is for example coupled to the non-inverting input of the amplifier 10 (designated by a "+" sign in the figure), via an impedance R2, for example a resistor of the same resistance value as R1. The non-inverting input of the amplifier 10 is also coupled to a power supply terminal brought to a ground potential Gnd, via an impedance R3, for example a resistor of the same resistance value as R1 and R2.

The circuit also comprises an output 40, which delivers the output signal Vout of the circuit. This signal corresponds to the input signal Vin as amplified in the ratio R4/R1, where R4 is the feedback impedance between the output of the circuit and the input of the amplifier 10, and to which sufficient power is provided to drive a load Rc, connected between the output 40 and the ground Gnd. The signal Vout is an appropriate voltage for driving a sound reproduction device such as a speaker or headset. Typically, the load Rc coupled to the output 40 is a speaker of the device in which the audio amplification circuit is used, a headset, earphones, or an external speaker which can be connected to a headset jack of this device.

In order to provide the required power, there is, between the output of the amplifier 10 and the output 40 of the circuit, at least one power output stage 22, whose output is coupled to the output 40 of the circuit. This stage is adapted to give to the signal Vout the power necessary to drive the load Rc. This is a driver stage, or driver circuit ("driver"), which comprises a P-MOS transistor and an N-MOS transistor connected one above the other between a positive power supply terminal Vdd and a negative power supply terminal Vss. These transistors are respectively referred to as MP2 and MN2 in the following description and in the figures. More particularly, the source of MP2 is coupled to the terminal Vdd, and the source of MN2 is coupled to the terminal Vss. Their drains are connected together, and constitute the output S2 of the driver stage 22. During operation, their control gates are also connected to each other, and constitute the input to the driver stage 22.

Typically, the operating point of the amplifier 10 is in the middle of the range of available voltages. This obtains the maximum dynamics for amplification of the input signal Vin. For example, the amplifier has an input stage with a differential structure, which amplifies the difference between the components V+ and V− of the input signal Vin. The operating point of the amplifier 10 is obtained by assigning a static current to each of the two branches of the differential pair constituting its input stage. This operating point is reached when the amplification circuit is powered on. As this is not instantaneous, transient phenomena occur which cause a glitch in the output signal Vout.

To avoid this glitch appearing in a form audible to the user in the output signal Vout, the output 13 from the amplifier 10 is not coupled to the input of the driver stage 22 during a first phase of operation which follows the powering on of the amplification circuit. In other words, the power output stage 22 (and therefore the load which is connected to the audio output 40) is uncoupled from the amplifier 10 during this first phase of operation, and coupled to it in a second phase of operation which follows the first phase of operation.

However, it is desirable that the operating point of the amplifier 10 is reached under conditions close to what they would be if the driver stage 22 were normally coupled to it. This is why another driver stage 21 in the amplification circuit is coupled to the output of the amplifier 10 during the first phase of operation. Conversely, this other stage 21 is uncoupled from the amplifier 10 during the second phase of operation. More particularly, the input of the stage 21 is coupled to the output 13 of the amplifier 10 in the first phase of operation, but not coupled to it during the second phase of operation.

The stage 21 is preferably of the same structure as the stage 22, in the sense that it comprises the same number of components, arranged in the same manner (but the size of the transistors is not necessarily the same, as will be described below). The stage 21 is also a driver stage, comprising a P-MOS transistor and an N-MOS transistor connected one above the other between the positive power supply terminal Vdd and the negative power supply terminal Vss. These transistors are respectively referred to as MP1 and MN1 in the following description and in the figures. The source of MP1 is coupled to the terminal Vdd, and the source of MN1 is coupled to the terminal Vss. Their drains are connected together, and constitute the output S1 of the driver stage 21. During operation, their control gates are also connected to each other, and constitute the input of the driver stage 21.

One will again note that the output S1 of the stage 21 is not coupled to the audio output 40 of the amplification circuit. In other words, the stage 21 is never coupled to the output of the amplification circuit, i.e. in neither the first nor in the second phase of operation. In this sense, the stage 21 can be regarded as a "dummy" output stage of the amplification circuit, as opposed to the stage 22 which is the "real" power output stage of the amplification circuit. The output of the amplifier 10 drives the dummy driver stage during the first phase of operation while it drives the real driver stage (power output stage which effectively drives the load Rc) during the second phase of operation.

In order to ensure the coupling or uncoupling of the driver stage 21 and the driver stage 22 during the first phase of operation and the second phase of operation, the circuit comprises a certain number of controlled switches which will now be described. There are switches whose opening and closing are controlled by a signal A and switches whose opening and closing are controlled by a signal B.

The amplification circuit comprises a control unit 30 generating these signals A and B. The signal A is active, for example in the high logic state (A=1), during the first phase of operation, and it is inactive, in the low logic state (A=0), during the second phase of operation. Conversely, the signal B is inactive (B=0) during the first phase of operation and active (B=1) during the second phase of operation. The signals A and B are not overlapping, in the sense that they are not both in the active state at the same time.

When the amplification circuit is powered on, the control unit 30 commands the signal A (A=1) to pass to the active state, while maintaining the signal B in the inactive state (B=0). This state can be maintained for a given period of time, for example 5 μs. At the end of this period of time, the signal A is rendered inactive (A=0) then the signal B is rendered active (B=1), avoiding any overlap of the two signals in the active state at the same time.

The output 13 of the amplifier 10 is thus coupled to the control gate of MP1 through a switch controlled by the signal A, and to the control gate of MN1 through another switch also controlled by the signal A. The control gate of MP1 is coupled to the terminal Vdd through a switch controlled by the signal B, and that of MN1 is coupled to the terminal Vss through another switch controlled by the signal B.

Reciprocally, the output 13 of the amplifier 10 is coupled to the control gate of MP2 through a switch controlled by the signal B, and to the control gate of MN2 through another switch also controlled by the signal B. The control gate of MP1 is coupled to the terminal Vdd through a switch controlled by the signal A, and that of MN1 is coupled to the terminal Vss through another switch controlled by the signal A.

The output S1 of the driver stage 21 is coupled to the output 40 of the amplification circuit through a switch controlled by the signal A followed by another switch which is controlled by the signal B. These two switches are therefore arranged serially between the output S1 of the stage 21 and the output 40 of the amplification circuit.

The node N situated between these two switches is coupled to the inverting input of the amplifier 10 through an impedance R4, for example a resistor of the same resistance value as the resistors R1, R2 and R3.

The operation of the amplification circuit, when it is powered on, is as follows. Initially, meaning immediately after power-on, all the switches are open, as the A and B signals are in the low logic state (A=B=0).

Once powered on, the control unit 30 causes the signal A to pass to the high logic state (A=1), which closes the switches controlled by this signal. The other switches, meaning those controlled by the signal B, remain open (B=0).

Figure 3:
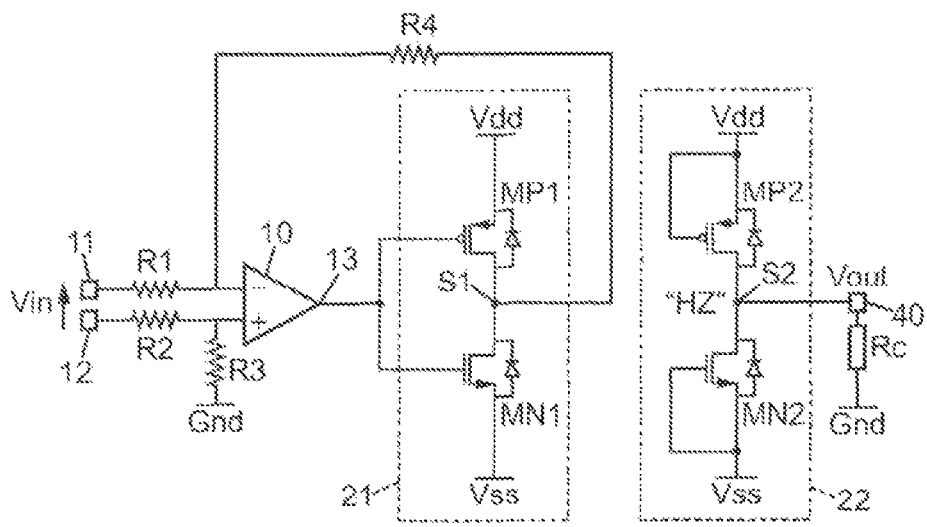
FIG. 3 represents the circuit in the first phase of operation.

The circuit is then in the configuration illustrated in FIG. 3, which corresponds to the first phase of operation. In this configuration, the output 13 of the amplifier 10 drives the driver stage 21. More particularly, it is coupled to the input of this stage 21, whose output S1 is looped to the input 11 of the amplifier 10 through the impedance R4. As will have been understood, this loop provides stabilization feedback to the amplifier. One will note that the output S1 of the stage 21 is not coupled to the output 40 of the amplification circuit.

The driver stage 22 is not coupled to the amplifier 10. More specifically, the control gates of MP2 and MN2 are not coupled to the output 13 of the amplifier 10, and are uncoupled from each other (they are not connected together). However, to avoid generating a direct path between the power supply terminals Vdd and Vss, the transistors MP2 and MN2 are blocked due to the coupling of their control gate to the terminal Vdd and to the terminal Vss, respectively. The output S2 of the driver stage 22 is then found in the high resistor state (state "HZ"). As this output S2 is coupled to the output 40 of the amplification circuit, said output 40 is in the high impedance state. From the point of view of this output 40, it is as if the amplification circuit was not receiving power.

During this first phase of operation, which immediately follows the power-on, the operating point of the amplifier 10 is therefore reached without the disturbances at its output 13, which cause the voltage peaks corresponding to the glitch, having any effect on the signal Vout at the output 40 of the amplification circuit.

At the end of a given period of time, for example 5 μs, the control unit 30 returns the signal A to the low logic state (A=0) then sets the signal B to the high logic state (B=1). It is ensured that, at the time of this transition, the signals A and B are not both active at the same time, although it will be understood that the time between the passage to the low state of the signal A and the passage to the high state of the signal B must of course be as short as possible.

Figure 4:
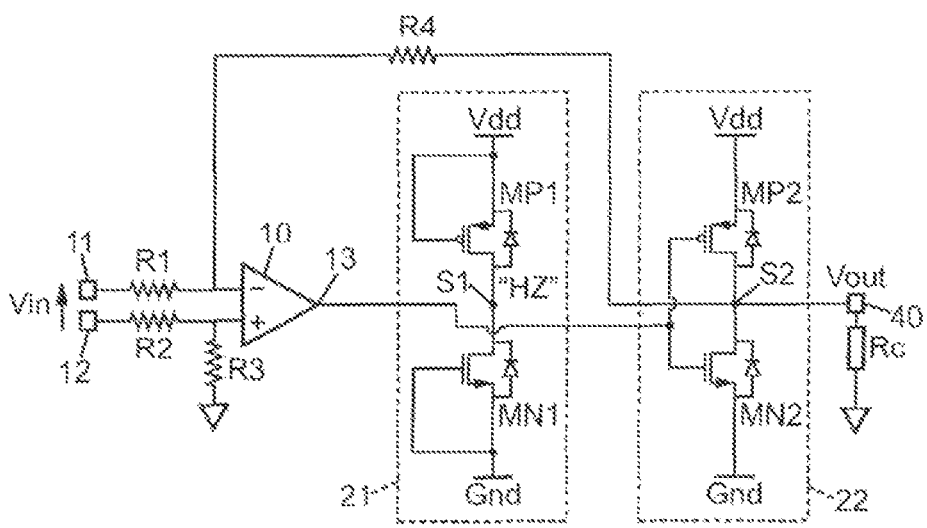
FIG. 4 represents the circuit in the second phase of operation.

The circuit is then in the configuration illustrated by FIG. 4, which corresponds to the second phase of operation. In this configuration, the driver stage 21 is uncoupled from the amplifier 10. It is in exactly the same configuration as the driver stage 22 during the first phase of operation, as described above. Its output S1 is in the high impedance state (S1=HZ). It seems unnecessary to repeat the corresponding description here.

On the other hand, the output 13 of the amplifier 10 is coupled to the input of the driver stage 22, meaning to the control gates of the transistors MP2 and MN2 which are then connected together. The output S2 of the stage 22 is still coupled to the output 40 of the amplification circuit. MP2 and MN2 are free to conduct current according to the sign and amplitude of the signal received at their common control gates.

In addition, the output S2 of the stage 22, which corresponds to the output 40 of the amplification circuit, is looped to the input 11 of the amplifier 10 by the same impedance R4 as was the output S1 of the stage 21 in the first phase of operation. In this configuration as well, the impedance R4 assures the stability of the amplification circuit. It is advantageous that it is the same impedance R4 in the first phase and in the second phase of operation. This avoids duplication of the impedance in the circuit (saving space on the chip), and also limits the transient phenomena occurring when passing from the first phase to the second phase of operation. In fact, the connections corresponding to the feedback through the impedance R4, which inherently have a capacitive component, are already partially charged at the end of the first phase.

The amplification circuit remains in the second phase of operation until the power to the circuit is cut off. From the point of view of the output 40 of the amplification circuit, it is as if the dummy driver stage 21 did not exist.

Figure 1:
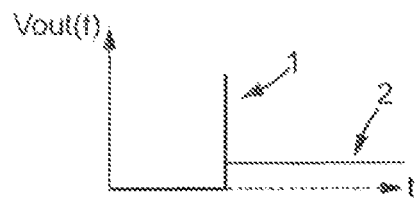
Figure 5:
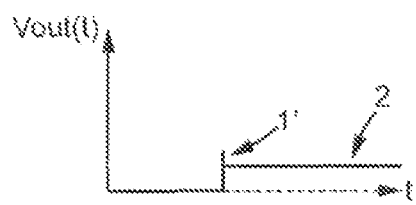
FIG. 5 is a graph over time at power-on of the output voltage from an audio amplifier with glitch cancellation according to embodiments of the invention.

As can be seen in the diagram in FIG. 5, the glitch 1' which occurs when the circuit is powered on is of course not quite nonexistent, but is greatly reduced compared to the glitch 1 illustrated in FIG. 1 (which corresponds to a circuit just described without the glitch cancellation). In practice, it has been observed that only a residual glitch of about 5 mV for about 100 ns is produced, in comparison to a glitch of 500 mV over 2 μs as mentioned in the introduction. Such a residual glitch is imperceptible to the user under normal ambient noise conditions. It is essentially due to the transient phenomena which occur in the power output stage 22 during the transition between the first phase and the second phase of operation, as well as to the effects of this transition produced at the output 13 of the amplifier 10.

Advantageously, as the driver stage 21 does not have the function of actually driving the load Rc, its transistors MP1 and MN1 do not need to be as large as the transistors MP2 and MN2 of the driver stage 22. In practice, MP1 and MN1 are sized to deliver to the output S1 a current substantially lower than that generated by MP2 and MN2 at the output S2 of the stage 22. This is obtained by setting the size (gate width) of the transistors MP1 and MN1 to a value much less than that of MP2 and MN2 respectively. For example, there can be a ratio of 100 between the two. This saves space on the chip.

Preferably, the transistors MP1 and MN1 can also be respectively nested (also said to be overlapping) with MP2 and MN2. This means that the silicon surface areas corresponding to their gate, drain, and source are independently controllable fractions of the corresponding areas of MP2 and MN2. Thus the addition of MP1 and MN1 has no additional cost in terms of silicon surface area, in comparison to an amplification circuit which does not incorporate the glitch cancellation described here.

The switches controlled by the signal A and the switches controlled by the signal B are, for example, realized using N-MOS transistors. The cost, in terms of silicon surface area, of implementing the glitch cancellation is therefore only the addition of ten MOS transistors plus the components of the control unit 30. This is negligible in comparison to the advantages obtained.

In one variation, the passage from the first phase of operation to the second phase of operation is not controlled by the expiration of a given period of time, but can be controlled by a reset signal at power-on (Power-On Reset, or POR).

Advantageously, the control unit 30 can be part of a unit managing the "mute" function of the device. In this case, the amplification circuit can be placed in the state corresponding to the second phase of operation each time the user commands a change to "mute" mode, or when activation of this mode is caused in any other manner (for example receipt of an incoming call on a mobile telephone). In other words, the dummy driver stage 21 is also used when the device is placed in "mute" mode. This provides the same glitch reduction advantages as those described above, each time the device enters or leaves this mode of operation.

Figure 6:
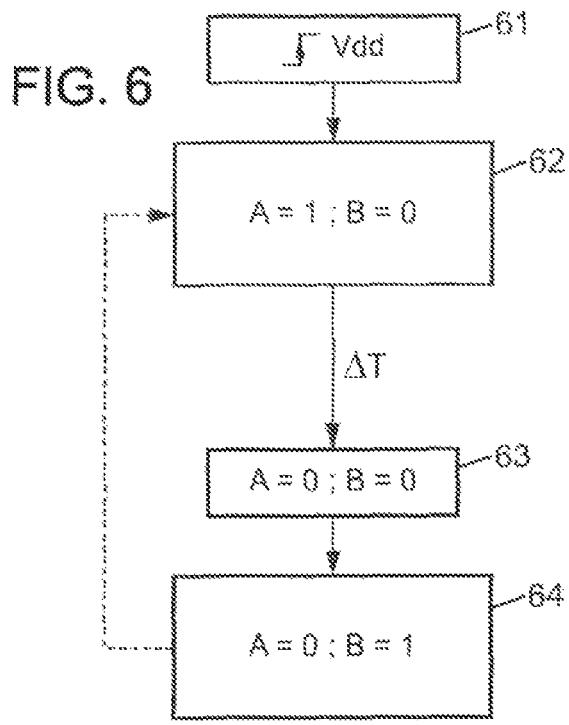
FIG. 6 is a diagram of the steps of a process implementing the amplification circuit.

FIG. 6 shows a schematic diagram of the steps of a process for implementing an amplification circuit as described above.

In a first step 61, the circuit is powered on. In particular, the amplifier 10 begins the process of reaching its operating point.

This is why, immediately after the power is turned on, in a step 62, the control unit 30 changes the signal A to the active state (A=1) while maintaining the signal B in the inactive state (B=0). The amplification circuit then passes into an operating mode corresponding to the first phase of operation which has been described.

At the end of a given time ΔT, corresponding for example to a predefined period of time, for example 5 μs, the control unit returns the signal A to the inactive state (A=0), and passes the signal B to the active state (B=1). This corresponds to the step 64. The amplification circuit then passes into an operating mode corresponding to the second phase of operation which has been described.

To illustrate the absence of overlap between the two phases of operation, an intermediate step 63 has been represented, in which the two signals A and B are in the low state (A=0; B=0), between the steps 62 and 64. This step 63 is as short as possible.

The dotted arrow between the blocks corresponding to steps 64 and 62 illustrates the fact that the amplification circuit can be returned to the mode corresponding to the first phase of operation, for example in response to activation of the "mute" mode of the device.

Figure 7:
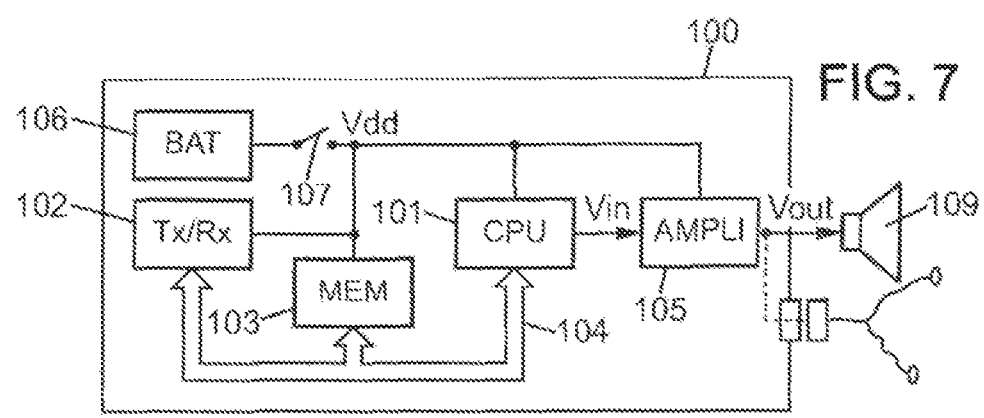
FIG. 7 is a simplified diagram of a device incorporating the amplification circuit.

The block diagram in FIG. 7 shows the elements of a device incorporating an audio amplifier as presented above. Such a device can be a mobile telephone or any other device for communication or not for communication, which has an audio reproduction function.

The device 100 comprises a control unit 101 such as a processor (CPU), and a communication unit 102 for sending and receiving information from the outside, in particular by modulating a radio frequency carrier. It also comprises a memory 103 which can store information in digital form, for example a piece of music. The processor 101 communicates with the unit 102 and the memory 103 via a communication bus 104. Each of these elements is powered by the supply voltage Vdd delivered by a battery through a control switch 107. When power is turned on, this switch 107 is closed.

The processor 101 generates an audio signal Vin to be amplified, either from data received via the unit 102, or from data read from the memory 103. To amplify this signal Vin, the device 100 comprises an audio amplification circuit 105 whose embodiments have been described above. This circuit 105 is also powered by the supply voltage Vdd which is applied through the switch 107 once power is turned on.

The output signal Vout generated by the amplification circuit 105 drives a speaker 109, which can be internal to the circuit 100 or external. As a variation or a supplement, it can also drive a headset jack 108 of the device 100, to allow the user to listen to audio using a headset or earphones.

The invention has been described with reference to certain embodiments. However, it is understood that any technically conceivable variation falls within the context of the present patent application.

The invention claimed is:

1. An audio amplification circuit, comprising:
    an amplifier having an input and an output;
    an audio output to which a load can be connected;
    a first driver stage having an input and an output which is not coupled to the audio output, and a second driver stage having an input and an output, which is coupled to the audio output; wherein the output from the amplifier is selectively coupled to the input of the first driver stage in a first phase of operation following the powering on of the circuit, or to the input of the second driver stage in a second phase of operation following the first phase of operation;
    an impedance arranged to couple the output from the first driver stage to the input of the amplifier in the first phase of operation, or the output from the second driver stage to the input of the amplifier in the second phase of operation.

2. The amplification circuit according to claim 1, wherein the second driver stage is a power output stage, sized to deliver a drive current having a given value, while the first driver stage is a stage of the same structure as the second driver stage but sized to deliver a current lower than said drive current.

3. The amplification circuit according to claim 1, additionally comprising a control unit configured to control the first phase of operation in response to the powering on of the circuit, and then to control the second phase of operation at the end of a given period of time.

4. The amplification circuit according to claim 3, wherein the control unit is additionally configured to control the first phase of operation in response to a signal activating a "mute" mode.

5. An electronic device comprising an audio signal source, and an amplifier according to claim 1, adapted to amplify an audio signal.

6. An audio amplification process using an amplification circuit comprising an amplifier having an input for receiving an input signal and an output, and additionally comprising an audio output to which a load can be connected, with the process consisting of:
   in a first phase of operation following the powering on of the circuit, coupling the output from the amplifier to an input of a first driver stage having an output which is not coupled to the audio output; then, selectively,
   in a second phase of operation following the first phase of operation, coupling the output from the amplifier to an input of a second driver stage having an output which is coupled to the audio output; and
   coupling, by an impedance, of the output from the first driver stage to the input of the amplifier in the first phase of operation, and coupling the output from the second driver stage to the input of the amplifier in the second phase of operation.

7. An amplification process according to claim 6, wherein the second driver stage is a power output stage sized to deliver a drive current having a given value, while the first driver stage is a stage of the same structure as the second driver stage but sized to deliver a current lower than said drive current.

8. An amplification process according to claim 6, wherein the first phase of operation is initiated in response to a powering on of the circuit, and then the second phase of operation is initiated at the end of a given period of time after the powering on of the circuit.

9. An amplification process according to claim 8, wherein the first phase of operation is additionally initiated in response to a signal activating a "mute" mode.

* * * * *